United States Patent
Holma et al.

(10) Patent No.: US 9,377,500 B2
(45) Date of Patent: Jun. 28, 2016

(54) EQUIPMENT AND A PLUG-IN UNIT OF THE EQUIPMENT

(71) Applicant: TELLABS OY, Espoo (FI)

(72) Inventors: Antti Holma, Espoo (FI); Heikki Laamanen, Espoo (FI)

(73) Assignee: CORIANT OY, Espoo (FI)

( * ) Notice: Subject to any disclaimer, the term of this patent is extended or adjusted under 35 U.S.C. 154(b) by 127 days.

(21) Appl. No.: 13/902,211

(22) Filed: May 24, 2013

(65) Prior Publication Data

US 2013/0314098 A1 Nov. 28, 2013

(30) Foreign Application Priority Data

May 28, 2012 (FI) ...................................... 20125565

(51) Int. Cl.
*G01R 31/04* (2006.01)
*H04B 3/46* (2015.01)
*G01R 31/28* (2006.01)

(52) U.S. Cl.
CPC .............. *G01R 31/045* (2013.01); *G01R 31/04* (2013.01); *G01R 31/2813* (2013.01); *H04B 3/46* (2013.01)

(58) Field of Classification Search
CPC ....... H01H 1/38; H01H 73/08; H01H 1/5866; H01H 27/00; H01H 50/048; H01H 2207/022; H01R 31/08; H01R 9/02; H01R 9/2491; H01R 12/7076; H01R 4/68; H01R 9/09; H01R 9/03; H01R 9/00; H01R 13/62983; H01R 25/003; H01R 13/6666; H01R 13/6658; H01R 31/06; H01R 13/112; H01R 2103/00; H01R 2201/20; H01R 9/2675; G06F 3/1225; H01L 27/13; H05K 1/117; H05K 3/308; H05K 5/0069; H04L 12/4633; H04L 12/2818; H04L 12/2859; G01R 31/041; G01R 31/04; G01R 31/043; G01R 31/045; G01R 31/31905; G01R 1/0416; G01R 31/00; G01R 31/2813; H04Q 1/13; H04B 3/46
USPC .................... 324/508, 750.01, 750.3, 756.02; 370/395.2; 439/620.01, 620.21, 65, 75, 439/775, 95; 361/656, 679.4
See application file for complete search history.

(56) References Cited

U.S. PATENT DOCUMENTS 5,461,693 A 10/1995 Pimpinella
5,811,980 A * 9/1998 Doyle et al. ............. 324/763.01

(Continued)

FOREIGN PATENT DOCUMENTS

EP 1 217 529 A2 6/2002
EP 2 254 397 A2 11/2010

(Continued)

OTHER PUBLICATIONS

Hewlett Packard, 8350A Sweep Oscillator, Hewlett Packard Company, pp. 1-27, Aug. 1980.*

(Continued)

*Primary Examiner* — Melissa Koval
*Assistant Examiner* — Nasima Monsur
(74) *Attorney, Agent, or Firm* — Young & Thompson

(57) ABSTRACT

Equipment including at least one plug-in unit (102) and a body device (101) for receiving the plug-in unit is presented. The equipment includes a circuit (124) including a test signal generator for supplying a test signal to a measurement circuit including galvanic contacts provided by electrical connectors between the body device and a plug-in unit so that the test signal belongs at least partly to a frequency band used in data transfer between the plug-in unit and the body device. The equipment includes a monitoring circuit for generating a signal indicative of a difference between a quantity responsive to the test signal and a reference. As the test signal belongs at least partly to the frequency band used in the data transfer, the quality of the galvanic contacts between the body device and the plug-in unit can be monitored concerning the behavior on the data transfer frequency band.

20 Claims, 8 Drawing Sheets

(56) References Cited

U.S. PATENT DOCUMENTS

| | | | |
|---|---|---|---|
| 6,104,198 A | 8/2000 | Brooks | |
| 7,855,567 B2 * | 12/2010 | Tsai et al. | 324/754.1 |
| 2004/0174180 A1 | 9/2004 | Fukushima et al. | |
| 2009/0089635 A1 * | 4/2009 | Chen et al. | 714/727 |
| 2010/0262391 A1 * | 10/2010 | Sauermann | 702/58 |
| 2010/0295561 A1 * | 11/2010 | Matero | 324/662 |

FOREIGN PATENT DOCUMENTS

| | | | | |
|---|---|---|---|---|
| JP | 2007317953 A | * | 12/2007 | H05K 7/14 |
| WO | 98/53382 A2 | | 11/1998 | |

OTHER PUBLICATIONS

European Search Report, dated Oct. 13, 2014, from corresponding EP application.

International Search Report, dated Jan. 16, 2013, from corresponding Finnish application.

* cited by examiner

EQUIPMENT AND A PLUG-IN UNIT OF THE EQUIPMENT

FIELD OF THE INVENTION

The invention relates to equipment comprising one or more plug-in units and a body device for receiving the plug-in units. The equipment can be, for example but not necessarily, telecommunication equipment. More particularly, the invention relates to a method for indicating correct installation of a plug-in unit. Furthermore, the invention relates to a plug-in unit.

BACKGROUND

In many cases it is advantageous that equipment is modular so that the equipment comprises a body device and plug-in units installed in the body device. The equipment can be, for example but not necessarily, telecommunication equipment such as an internet protocol "IP" router, an Ethernet switch, an Asynchronous Transfer Mode "ATM" switch, and/or a MultiProtocol Label Switching "MPLS" switch. A commonly used construction is such that the telecommunication equipment comprises a frame and plug-in units which are installed in plug-in unit slots of the frame. In this case, the frame represents a body device for receiving the plug-in units. Electrical connectors in a plug-in unit make galvanic contacts with corresponding electrical connectors in the frame when the plug-in unit is inserted in the plug-in unit slot of the frame. The frame may have wirings such that plug-in units installed in the frame form a full mesh network or such that plug-in units installed in the frame are connected to a central element which may comprise one or more plug-in units installed in the frame or which may be a functional component integrally built in the frame.

Care is needed in the installation of a plug-in unit in a body device because galvanic contacts between the electrical connectors of the plug-in unit and corresponding electrical connectors of the body device may be poor, or even non-existent, if the plug-in unit is not properly installed in its place. In one prior-art solution, pins of some poles in the electrical connectors between the plug-in unit and the body device are shorter than pins of other poles in these electrical connectors. These shorter pins are part of a test circuit for detecting whether the plug-in unit is installed in such a way that the shorter pins make galvanic contacts in the electrical connectors. If the shorter pins make the galvanic contacts, there is a good certainty that also the longer pins in the electrical connectors make adequate galvanic contacts. However, in conjunction with some electrical connector structures and especially in conjunction with high data transfer rates through the electrical connectors, it may be challenging to provide an arrangement where proper galvanic contacts provided by some poles of an electrical connector are able to guarantee sufficiently high quality data transfer via other poles of the electrical connector. Therefore, there is a need for other technical solutions for indicating correct installation of a plug-in unit.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the first aspect of the invention, there is provided new equipment that can be, for example but not necessarily, telecommunication equipment. The equipment according to the invention comprises:
 one or more plug-in units,
 a body device for receiving the one or more plug-in units,
 electrical connectors in the one or more plug-in units and in the body device, the electrical connectors being suitable for providing galvanic contacts between each of the one or more plug-in units and the body device,
 a test signal generator for supplying a test signal to a measurement circuit comprising first and second galvanic contacts provided by the electrical connectors between the body device and one of the plug-in units, the frequency spectrum of the test signal belonging at least partly to a frequency band used in data transfer between the one of plug-in units and the body device, and
 a monitoring circuit for generating an indicator signal indicative of a difference between a quantity responsive to the test signal and a reference of the quantity.

The above-mentioned indicator signal is also indicative of the correctness of the installation of the plug-in unit in the body device. Furthermore, this indicator signal indicates not only the existence of the galvanic contacts between the body device and the plug-in unit under consideration but also the quality of the galvanic contacts from the viewpoint of the behavior on the data transfer frequency band. Therefore, the information obtained is more relevant from the viewpoint of the data transfer than, for example, in a case where the existence of the galvanic contacts is tested using direct "DC" current.

The above-mentioned test signal generator and monitoring circuit can be located in a same plug-in unit or in different plug-in units. It is also possible that the test signal generator is located in a plug-in unit and the monitoring circuit is located in the body device, or that the test signal generator is located in the body device and the monitoring circuit is located in a plug-in unit, or that both the test signal generator and the monitoring circuit are located in the body device.

In accordance with the second aspect of the invention, there is provided a new plug-in unit. The plug-in unit according to the invention comprises:
 an electrical connector for connecting the plug-in unit to circuitries of a body device when the plug-in unit is inserted in the body device, and
 a test signal generator for supplying a test signal to first and second poles of the electrical connector, the frequency spectrum of the test signal belonging at least partly to a frequency band used in data transfer between the plug-in unit and the body device, and
 a monitoring circuit for generating an indicator signal indicative of a difference between a quantity responsive to the test signal and a reference of the quantity.

In accordance with the third aspect of the invention, there is provided a new method for indicating correct installation of a plug-in unit in a body device. The method according to the invention comprises:
 supplying a test signal to a measurement circuit comprising first and second galvanic contacts provided by electrical connectors between the body device and the plug-in unit, the frequency spectrum of the test signal belonging at least partly to a frequency band used in data transfer between the plug-in unit and the body device, and
 generating an indicator signal indicative of a difference between a quantity responsive to the test signal and a reference of the quantity, the indicator signal being also indicative of correctness of the installation of the plug-in unit.

A number of non-limiting exemplifying embodiments of the invention are described in accompanied dependent claims.

Various non-limiting exemplifying embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of unrecited features. The features recited in depending claims are mutually freely combinable unless otherwise explicitly stated.

BRIEF DESCRIPTION OF THE FIGURES

The exemplifying embodiments of the invention and their advantages are explained in greater detail below in the sense of examples and with reference to the accompanying drawings, in which.

DESCRIPTION OF THE EXEMPLIFYING EMBODIMENTS

Figure 1A:
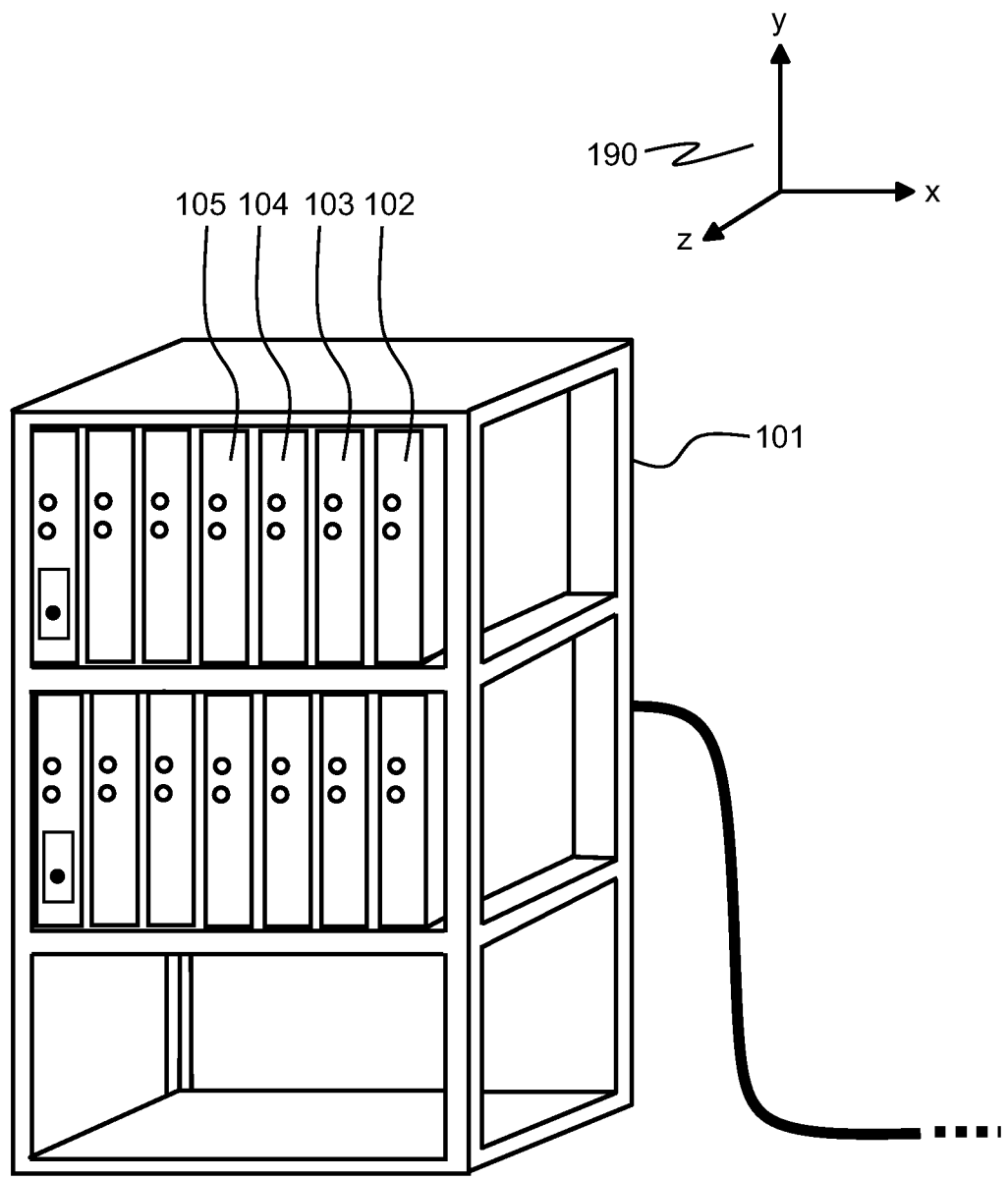
FIG. 1a shows a perspective view of equipment according to an exemplifying embodiment of the invention.

FIG. 1a shows a perspective view of equipment according to an exemplifying embodiment of the invention. The equipment can be, for example but not necessarily, telecommunication equipment such as an internet protocol "IP" router, an Ethernet switch, and Asynchronous Transfer Mode "ATM" switch, and/or a multiprotocol label switching "MPLS" switch. The equipment comprises a body device 101 and plug-in units installed in the body device. Some of the plug-in units are designated by reference numbers 102, 103, 104, and 105. In the exemplifying case shown in FIG. 1a, the body device is a frame comprising plug-in unit slots in which the plug-in units can be installed by pushing each plug-in unit in the negative z-direction of the coordinate system 190. The frame may comprise, for example, wirings such that the plug-in units installed in the frame form a full mesh network or such that the plug-in units installed in the frame are connected to a central element of the equipment which may comprise one or more plug-in units installed in the frame or which may be a functional component integrally built in the frame. The wirings are typically located on the backplane of the frame. It is also possible that a body device represents a bigger part of equipment than just a frame which interconnects and possibly controls the plug-in units. The equipment can be, for example, monitoring and alarming equipment comprising for example a camera, a motion sensor, and/or a transceiver each of which can be a plug-in unit or an integral part of the body-device of the equipment.

Figure 1B:
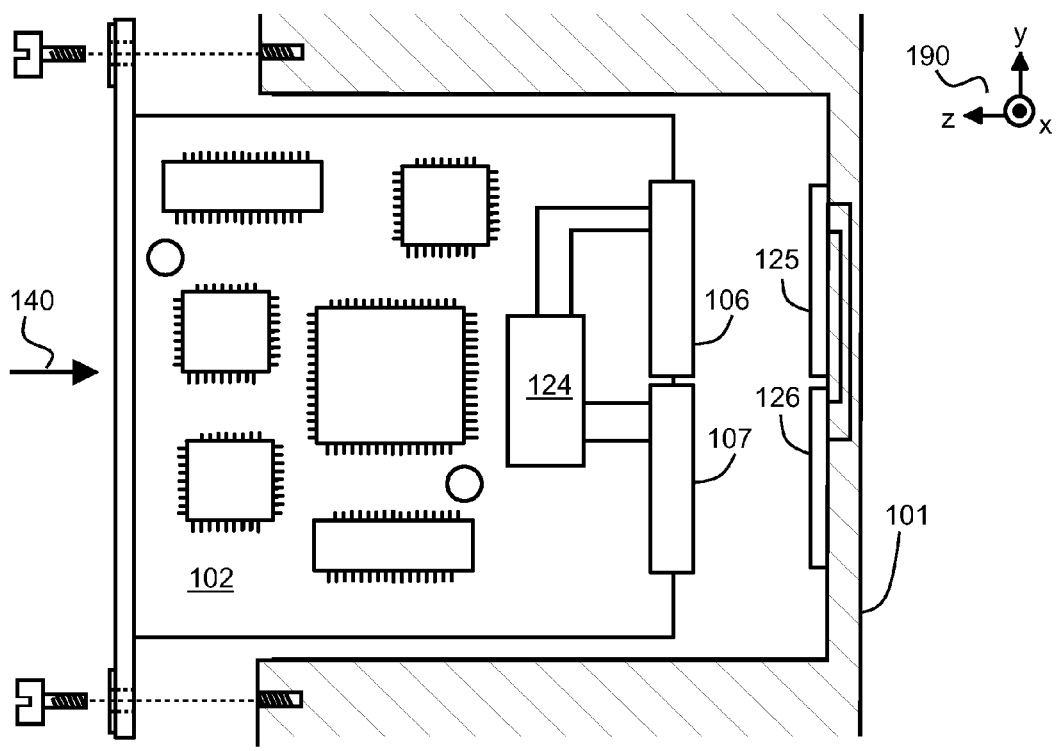
FIGS. 1b and 1c illustrate a plug-unit and a part of a body device of the equipment shown in FIG. 1a, FIG. 1d shows a schematic circuit diagram of a detail shown in FIG. 1c.
Figure 1C:
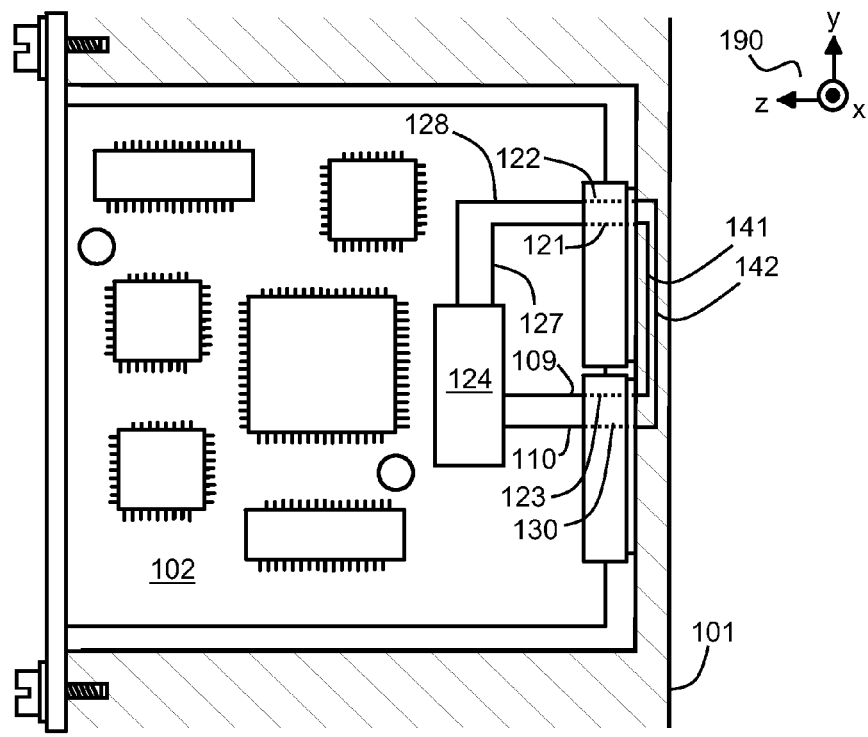

FIGS. 1b and 1c illustrate the plug-unit 102 of the equipment shown in FIG. 1a and a part of the body device 101 of the equipment. The plug-in 102 unit may comprise a processing system for handling data communications. The processing system may be configured to support the functionality of, for example: an Internet Protocol "IP" router, an Asynchronous Transfer Mode "ATM" switch, an Ethernet switch, and/or a MultiProtocol Label Switching "MPLS" switch. The plug-in unit 102 may also be, for example, a power supply unit or and/a control unit in which case it might not include a processing system to handle data communications.

The equipment comprises electrical connectors 106 and 107 in the plug-in unit 102, and corresponding electrical connectors 125 and 126 in the body device 101. These electrical connectors form galvanic contacts between the plug-in unit 102 and the body device 101 when the plug-in unit is inserted in the body device along the direction of an arrow 140 shown in FIG. 1a. The plug-in unit 102 comprises a circuit 124 which comprises a test signal generator for supplying a test signal to first and second poles of the electrical connector 107 via wirings 109 and 110, FIG. 1c. The test signal generator is configured to generate the test signal so that the frequency spectrum of the test signal belongs at least partly to a frequency band used in data transfer between the plug-in unit 102 and the body device 101. In the exemplifying embodiment illustrated by FIGS. 1b and 1c, the circuit 124 comprises also a monitoring circuit for generating an indicator signal indicative of a difference between a quantity responsive to the test signal and a reference of the quantity. The wirings 109 and 110 and wirings 127 and 128 in the plug-in unit and wirings 141 and 142 in the body-device are part of a measurement circuit that comprises galvanic contacts 123 and 130 between the electrical connectors 107 and 126, and galvanic contacts 121 and 122 between the electrical connectors 125 and 106. The galvanic contacts 121, 122, 123, and 130 are illustrated as dashed lines in FIG. 1c. As the test signal belongs at least partly to the frequency band used in the data transfer, the above-mentioned indicator signal indicates not only the existence of the galvanic contacts 121, 122, 123, and 130 but also the quality of these galvanic contacts from the viewpoint of the behavior on the data transfer frequency band.

Figure 1D:
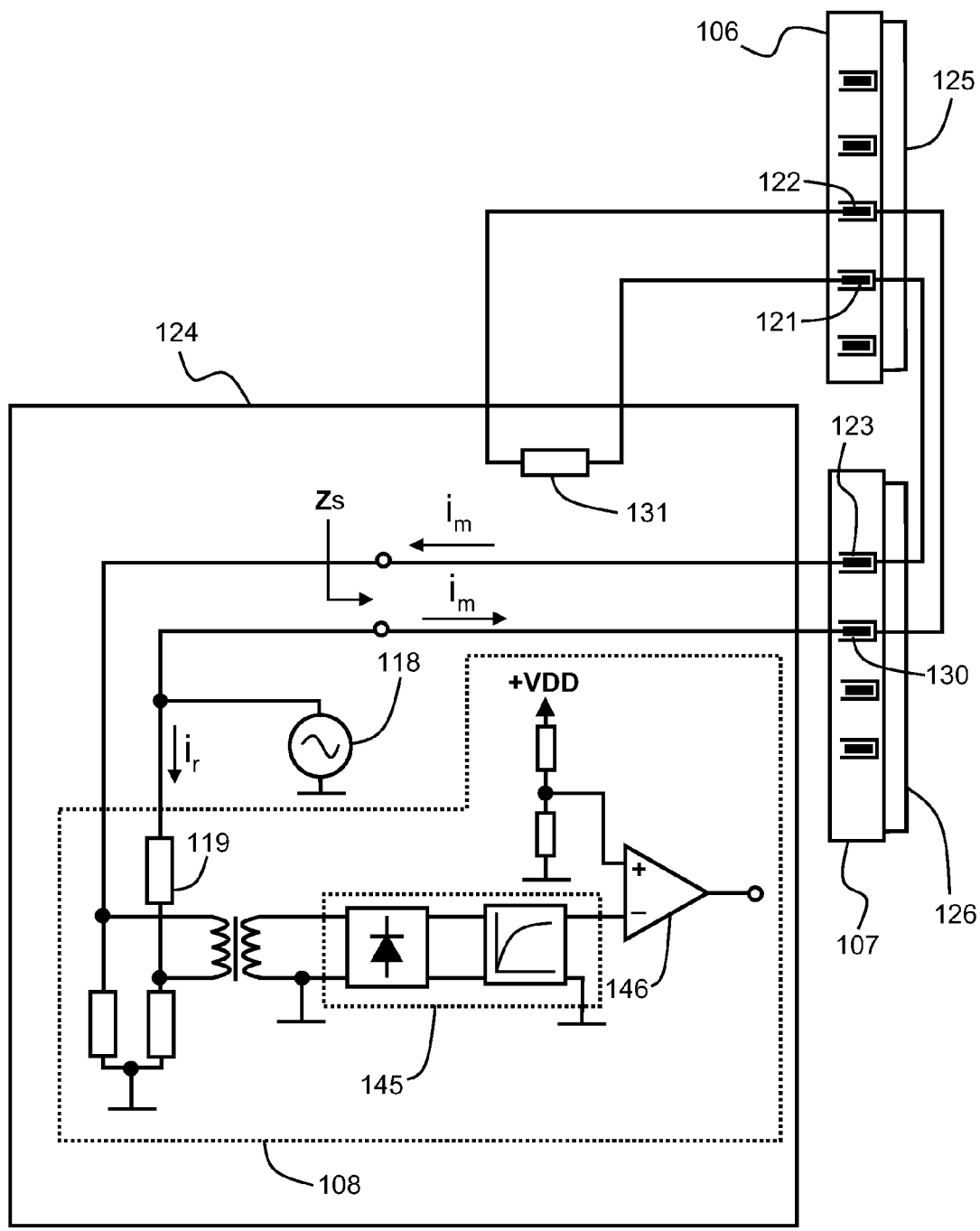
FIG. 1e shows a schematic circuit diagram that is alternative to the circuit diagram shown in FIG. 1d.

FIG. 1d shows a schematic circuit diagram of the circuit 124 shown in FIGS. 1b and 1c. FIG. 1d also shows a schematic illustration of the measurement circuit which comprises the galvanic contact 123 between the first pole of the electrical connector 107 and the respective pole of the electrical connector 126, the galvanic contact 130 between the second pole of the electrical connector 107 and the respective pole of the electrical connector 126, and the galvanic contacts 121 and 122 between the electrical connectors 106 and 125. An element denoted with the reference number 118 in FIG. 1d represents the test signal generator for supplying the test signal to the first and second poles of the electrical connector 107. In this exemplifying case, the test signal generator 118 comprises a test voltage generator for producing substantially sinusoidal test voltage. The frequency of the test voltage belongs to the frequency band used in the data transfer between the plug-in unit and the body device. The rate of the data transfer can be so high that the wirings behave as a distributed transfer line at least on a part of the data transfer band. In this case, the frequency of the test voltage is advantageously selected so that the wirings behave as a distributed transfer line for the test voltage too. The circuit 124 comprises a terminal impedance component 131 that is preferably dimensioned to match with the wave impedance of the wirings. The terminal impedance component 131 can be, for example, a resistor having a resistance value equal to the above-mentioned wave impedance, a transfer line stub having a pre-determined length, or some other suitable circuit element providing desired impedance. It is also possible that there is no terminal impedance component, i.e. the measurement circuit is open ended or ended with a short circuit. A circuit denoted with the reference number 108 in FIG. 1d represents the monitoring circuit for generating the indicator signal indicative of the difference between a quantity responsive to the substantially sinusoidal test voltage and the reference of the quantity. In this exemplifying case, the monitoring circuit 108 comprises a measurement bridge connected to the first and second poles of the electrical connector 107 as illustrated in FIG. 1d. The measurement bridge comprises a reference circuit 119 adapted to simulate the driving point impedance Zs of the measurement circuit corresponding to correct installation of the plug-in unit. If the driving point impedance Zs of the measurement circuit is the same as the impedance of the reference circuit 119, the measurement bridge illustrated in FIG. 1d is balanced and, as a corollary, the input voltage of a rectifying circuit 145 is substantially zero and thereby the output voltage of a comparator 146 is down. The output voltage of the rectifying circuit 145 can be considered to represent the indicator signal indicative of the difference between the quantity responsive to the substantially sinusoidal test voltage and the reference of the quantity. In this case, the above-mentioned quantity can be considered to be the current $i_m$ of the measurement circuit and the above-mentioned reference can be considered to be the current $i_r$ of the reference circuit 119. When these currents are sufficiently close to each other, the output voltage of the comparator 146 is down, which indicates that the plug-in unit is correctly installed. A reference voltage for the comparator 146 can be formed by voltage division from direct "DC" supply voltage +VDD as illustrated by FIG. 1d.

Figure 1E:
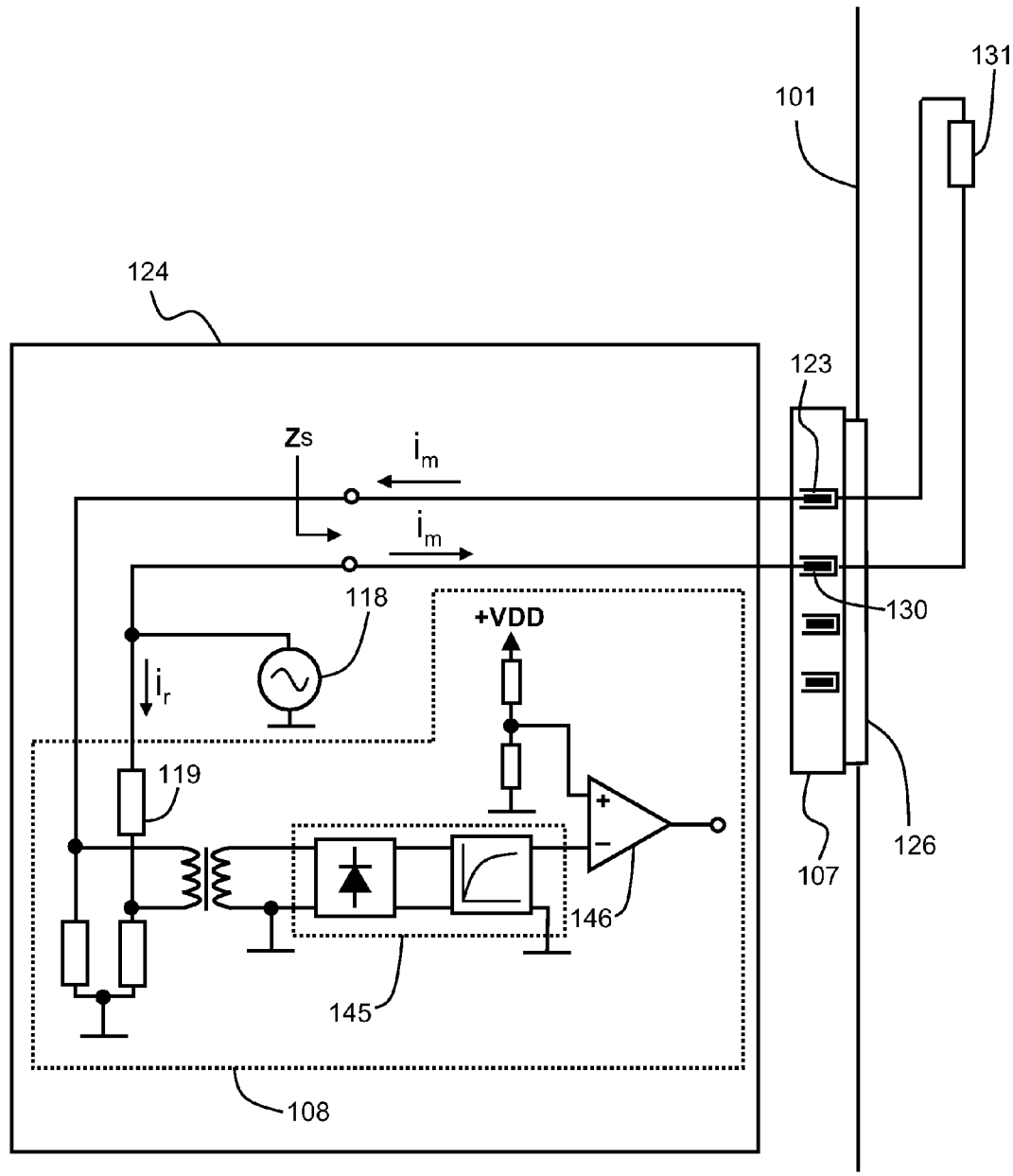

FIG. 1e shows a schematic circuit diagram that otherwise corresponds to the schematic circuit diagram shown in FIG. 1d, but the terminal impedance component 131 is located in the body device 101 instead of being located in the plug-in unit 102. It is also possible that the terminal impedance component 131 is located in some other plug-in unit than the plug-in unit 101 in which the circuit 124 is located.

Figure 2:
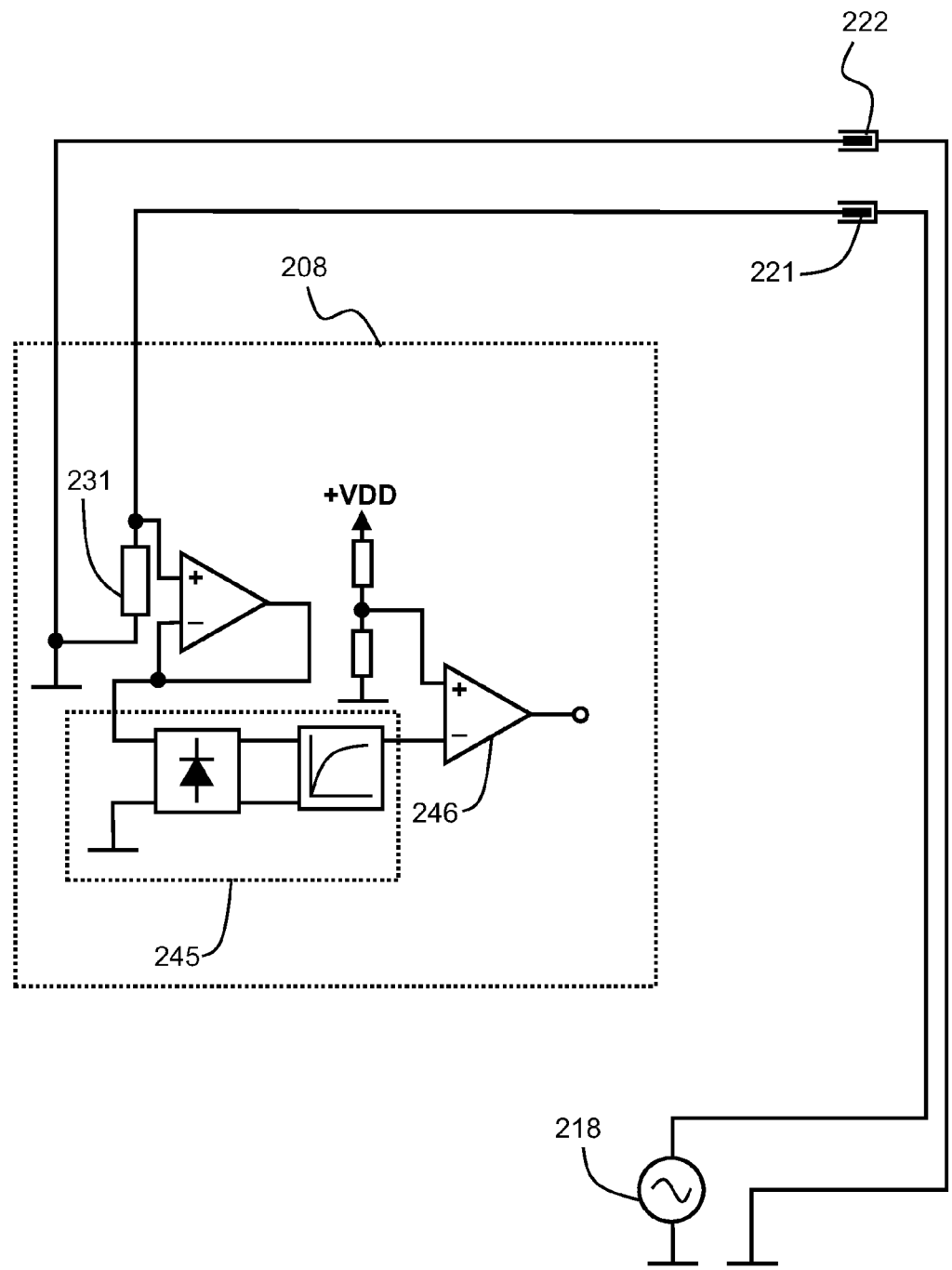
FIG. 2 shows a schematic circuit diagram of a detail of equipment according to an exemplifying embodiment of the invention.

FIG. 2 shows a schematic circuit diagram of a detail of equipment according to an exemplifying embodiment of the invention. The equipment comprises a test signal generator 218 for supplying a test signal to a measurement circuit comprising galvanic contacts 221 and 222 that are provided by first and second poles of electrical connectors between a plug-in unit and a body device of the equipment when the plug-in unit is installed in the body-device. The test signal generator 218 is configured to generate the test signal so that the frequency spectrum of the test signal belongs at least partly to a frequency band used in data transfer between the plug-in unit and the body device. The equipment comprises a monitoring circuit 208 for generating an indicator signal indicative of a difference between a quantity responsive to the test signal and a reference of the quantity. In this exemplifying case, the test signal generator 218 comprises a test voltage generator for producing substantially sinusoidal test voltage. The monitoring circuit 208 comprises a terminal impedance component 231 and a rectifying circuit 245 for producing a signal that is proportional to amplitude of alternating voltage of the terminal impedance component. The signal proportional to the amplitude is compared to a reference voltage with the aid of a comparator 246. The output voltage of the comparator 246 can be considered to represent the above-mentioned indicator signal indicative of a difference between a quantity responsive to the test signal and the reference of the quantity. In this case, the above-mentioned quantity responsive to the test signal can be considered to be the output signal of the rectifying circuit 245 and the above-mentioned reference can be considered to be the reference voltage formed by voltage division from direct "DC" supply voltage +VDD as illustrated by FIG. 2. The reference voltage is selected so that it is lower than the output signal of the rectifying circuit 245 when the plug-in unit is correctly installed and higher than the output signal of the rectifying circuit 245 when the plug-in unit is incorrectly installed. When being down, the output voltage of the comparator 246 indicates that the plug-in unit is correctly installed.

The test signal generator 218 can be located in the body device and the monitoring circuit 208 can be located in the plug-in unit whose installation is monitored. It is also possible that the test signal generator 218 is located in the plug-in unit and the monitoring circuit 208 is located in the body device. It is also possible that both the test signal generator 218 and the monitoring circuit 208 are located in the body device or in the plug-in unit. In this case, the measurement circuit would comprise four galvanic contacts in the same way as illustrated in FIG. 1d. It is also possible that the test signal generator 218 and the monitoring circuit 208 are located in different plug-in units. Also in this case, the measurement circuit would comprise four galvanic contacts in the same way as illustrated in FIG. 1d.

It is to be noted that in the examples illustrated above with the aid of FIGS. 1d and 2, the waveform of the test signal does not necessarily need to be substantially sinusoidal. For example, with standard circuit synthesis methods, the impedance of the reference circuit 119 can be designed to have, on a given frequency range, a similar frequency dependency as has the driving point impedance Zs of the measurement circuit when the installation of the plug-in unit is correct. In this case, the test signal can be non-sinusoidal so that its frequency spectrum belongs to the above-mentioned frequency range.

Figure 3:
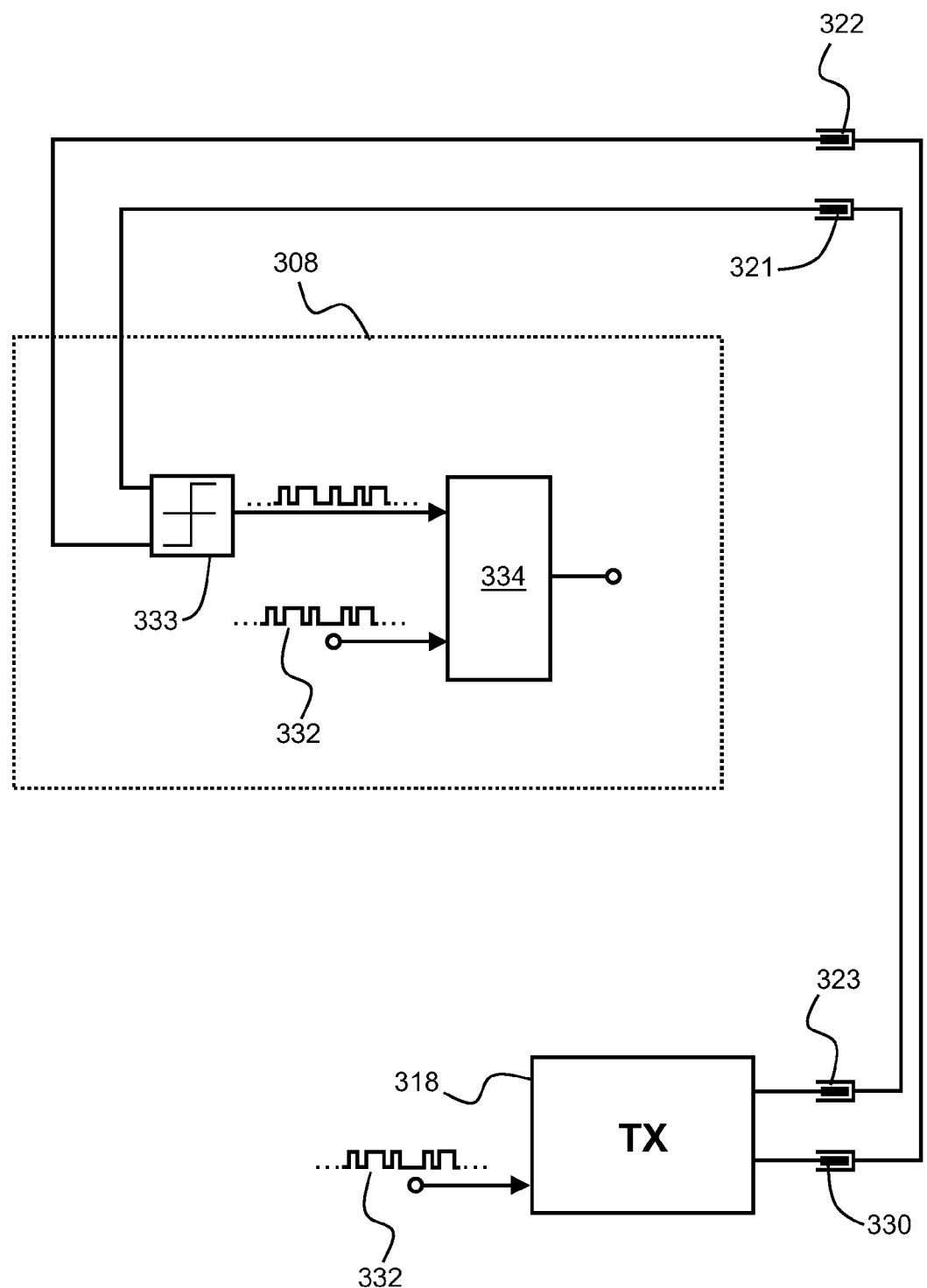
FIG. 3 shows a schematic block diagram of a detail of equipment according to an exemplifying embodiment of the invention.

FIG. 3 shows a schematic block diagram of a detail of equipment according to an exemplifying embodiment of the invention. The equipment comprises a test signal generator 318 for supplying a test signal to a measurement circuit comprising galvanic contacts 321, 322, 323 and 330 that are provided by electrical connectors between a plug-in unit and a body device of the equipment when the plug-in unit is installed in the body-device. The test signal generator 318 is configured to generate the test signal so that the frequency spectrum of the test signal belongs at least partly to a frequency band used in data transfer between the plug-in unit and the body device. The equipment comprises a monitoring circuit 308 for generating an indicator signal indicative of a difference between a quantity responsive to the test signal and a reference of the quantity. In this exemplifying case, the test signal generator 318 comprises a test traffic transmitter configured to modulate the test signal with a pre-determined reference bit sequence 332. The monitoring circuit 308 comprises a detector 333 configured to detect a bit sequence from the quantity responsive to the test signal. In this case, the quantity responsive to the test signal is the signal prevailing at the input of the detector 333. The monitoring circuit 308 further comprises a comparing circuit 334 configured to produce a bit error ratio "BER" of the detected bit sequence with respect to the pre-determined reference bit sequence 332. When being zero or below a pre-determined threshold, the bit error ratio indicates that the plug-in unit is correctly installed. The line code used in conjunction with the test signal is preferably the same as the line code used in conjunction with payload traffic between the plug-in unit and the body device.

The test signal generator 318 and the monitoring circuit 308 can be located in a same plug-in unit or in different plug-in units. It is also possible that the test signal generator 318 is located in the body device and the monitoring circuit 308 is located in the plug-in unit whose installation is monitored, or vice versa. In this case, the measurement circuit needs to comprise only two galvanic contacts in the same way as illustrated in FIG. 2.

It is to be noted that any of the exemplifying embodiments of the invention presented above with the aid of FIGS. 1b, 1c, 2 and 3 may comprise more galvanic contacts than those shown in these figures. For example, the measurement circuit may contain a chain of plug-in units so that the test signal generator is located in a first plug-in unit, the monitoring circuit is located in a second plug-in unit, and there are one or more third plug-in units on the route of the measurement circuit between the said first and second plug-in units.

Furthermore, it is to be noted that that the above-presented principles for detecting whether the galvanic contacts between the plug-in units and the body device have sufficiently good quality on the data transfer frequency band are only non-limiting examples and numerous different approaches can be used for the detection of the quality of the galvanic contacts. For example, it is possible to provide a test signal generator configured to produce substantially sinusoidal voltage with a serial impedance component such that the impedance of the test signal generator becomes a complex conjugate of the driving point impedance of the measurement circuit corresponding to correct installation of the relevant plug-in unit or units. When the impedance of the test signal generator and the driving point impedance of the measurement circuit are complex conjugates of each other, the power submitted by the test signal generator to the measurement circuit is maximized. The monitoring circuit may comprise a detector for detecting the power submitted to the measurement circuit. In this case, the quantity responsive to the test signal is the power submitted to the measurement circuit and the reference, i.e. in this case the desired value of the power, is the maximized value of the power.

Figure 4:
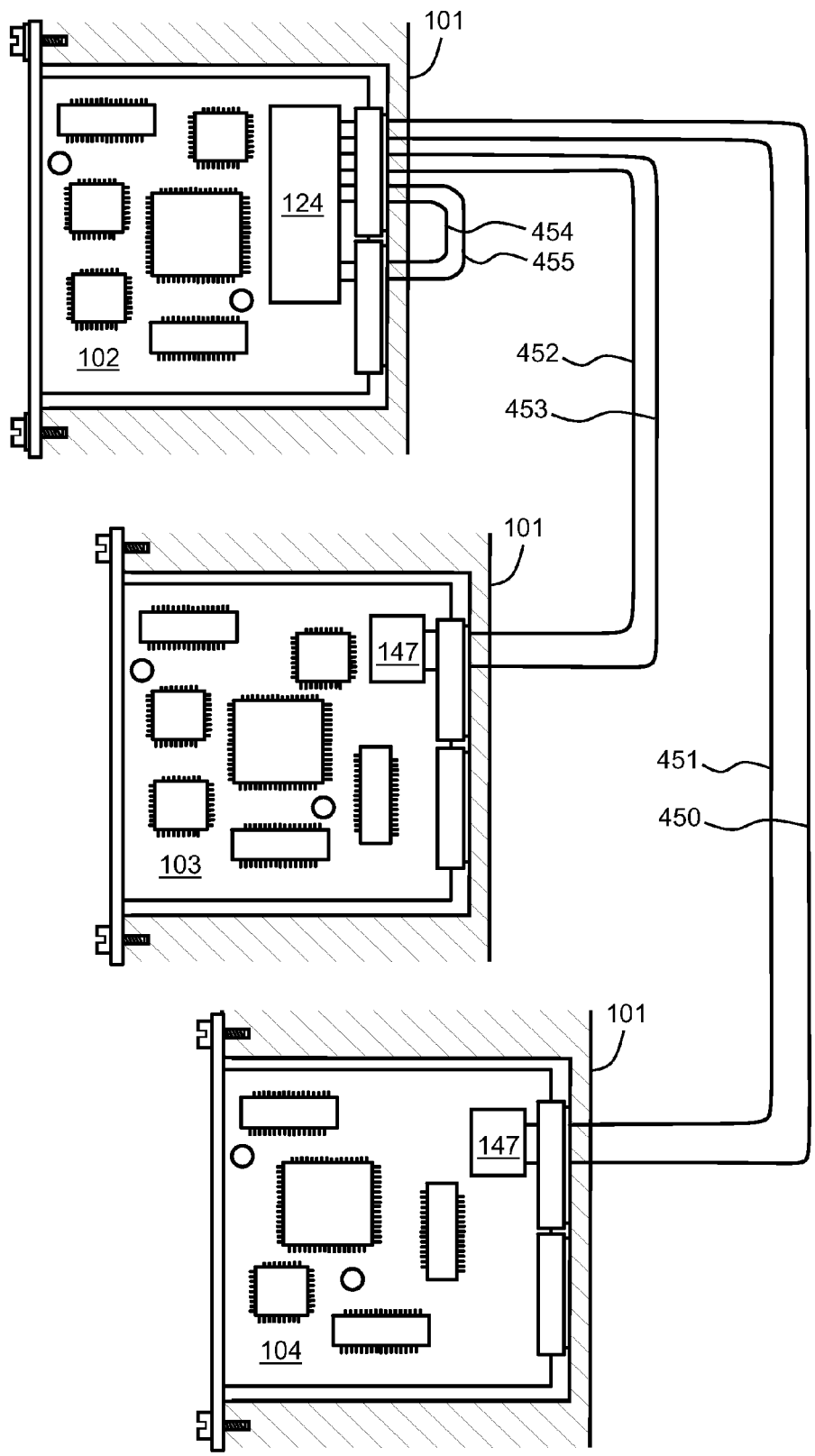
FIG. 4 illustrates an exemplifying configuration of the equipment shown in FIG. 1a, and FIG. 5 shows a flowchart of a method according to an exemplifying embodiment of the invention for indicating correct installation of a plug-in unit.

FIG. 4 illustrates an exemplifying configuration of the equipment shown in FIG. 1a. In this configuration, the plug-in unit 102 is a control plug-in unit in which the circuit 124 is configured to produce, in addition to the indicator signal related to this plug-in unit 102, corresponding signals related to other plug-in units 103 and 104. Each of the plug-in units 103 and 104 comprises a terminating circuit 147 which can be e.g. a terminal impedance component such as the terminal impedance component 131 shown in FIG. 1d. In the exemplifying case shown in FIG. 4, the wiring of the body device comprises electrical conductors 450, 451, 452, 453, 454, and 455. The measurement circuit related to the plug-in units 102 and 104 comprises the electrical conductors 450 and 451, the measurement circuit related to the plug-in units 102 and 103 comprises the electrical conductors 452 and 453, and the measurement circuit related to the plug-in unit 102 alone comprises the electrical conductors 454 and 455. In the above-described configuration, the plug-in unit 102, i.e. the control plug-in unit, can be made aware of the installation of itself and of the installations of the other plug-in units.

Figure 5:
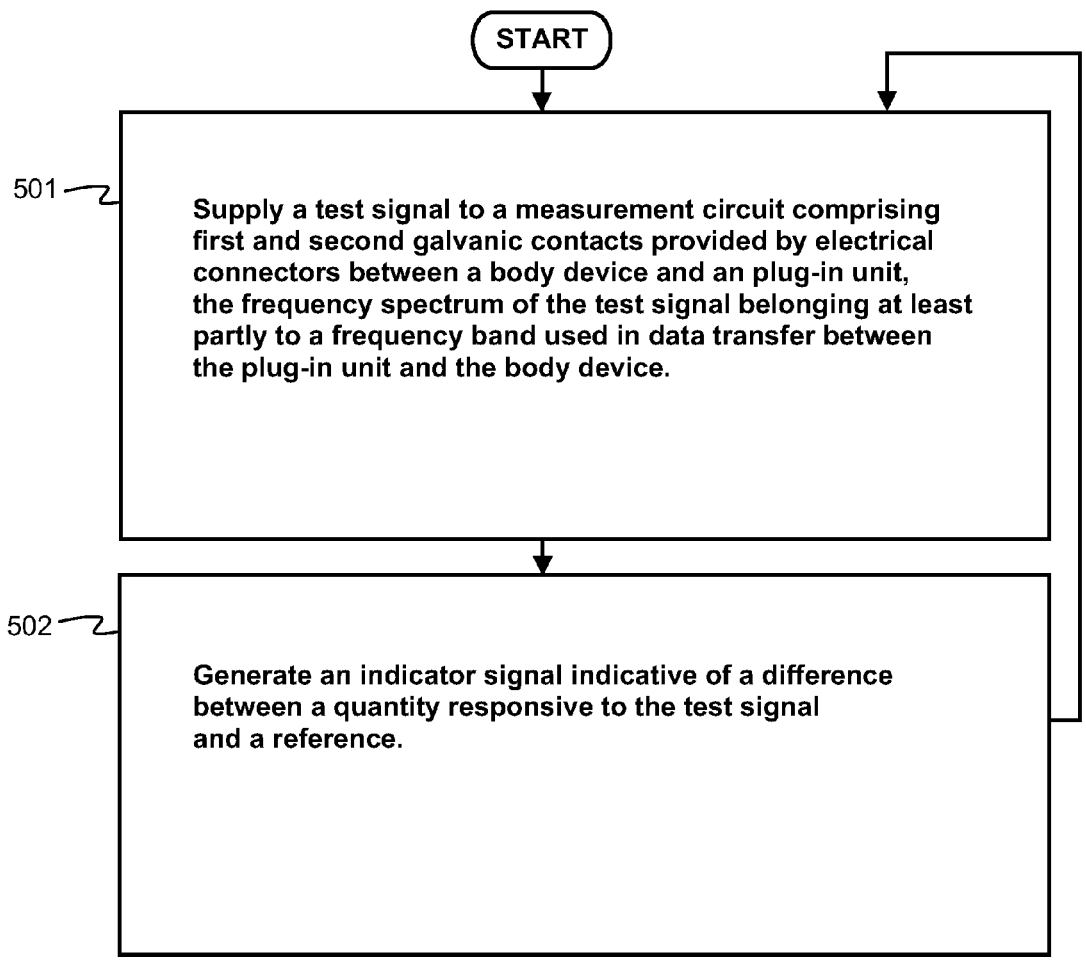

FIG. 5 shows a flowchart of a method according to an exemplifying embodiment of the invention for indicating correct installation of a plug-in unit in a body device. The method comprises the following actions:

action 501: supplying a test signal to a measurement circuit comprising at least first and second galvanic contacts provided by electrical connectors between the body device and the plug-in unit, the frequency spectrum of the test signal belonging at least partly to a frequency band used in data transfer between the plug-in unit and the body device, and action 502: generating an indicator signal indicative of a difference between a quantity responsive to the test signal and a reference of the quantity, the indicator signal being also indicative of correctness of the installation of the first plug-in unit.

In a method according to an exemplifying embodiment of the invention, the test signal is substantially sinusoidal test voltage whose frequency belongs to the frequency band used in the data transfer between the plug-in unit and the body device.

In a method according to an exemplifying embodiment of the invention, the generating of the indicator signal comprises detecting amplitude of alternating voltage of an impedance component which terminates the measurement circuit.

In a method according to an exemplifying embodiment of the invention, the indicator signal is generated using a measurement bridge connected to the measurement circuit. The measurement bridge comprises a reference circuit adapted to simulate the driving point impedance of the measurement circuit corresponding to correct installation of the plug-in unit.

In a method according to an exemplifying embodiment of the invention, the test signal is modulated with a pre-determined reference bit sequence.

In a method according to an exemplifying embodiment of the invention, the generating of the indicator signal comprises detecting a bit sequence from the quantity responsive to the test signal, and producing a bit error ratio "BER" of the detected bit sequence with respect to the pre-determined reference bit sequence.

The specific examples provided in the description given above should not be construed as limiting the applicability and/or the interpretation of the appended claims.

What is claimed is:

1. A plug-in unit, comprising:
   an electrical connector for connecting the plug-in unit to wirings of a body device when the plug-in unit is inserted in the body device, the electrical connector being suitable for providing galvanic contacts between the plug-in unit and the body device;
   a test signal generator for supplying a test signal to first and second poles of the electrical connector, the first and second poles of the electrical connector being suitable for providing first and second ones of the galvanic contacts between the body device and the plug-in unit, and the frequency spectrum of the test signal belonging at least partly to a frequency band used in data transfer between the plug-in unit and the body device; and
   a monitoring circuit for generating an indicator signal indicative of a difference between a quantity responsive to the test signal when current responsive to the test signal flows via the first and second ones of the galvanic contacts and a reference of the quantity, the indicator signal being also indicative of correctness of the installation of the plug-in unit in the body device.

2. The plug-in unit according to claim 1, wherein the test signal generator comprises a test voltage generator for producing substantially sinusoidal test voltage.

3. The plug-in unit according to claim 2, wherein the monitoring circuit comprises a terminal impedance component for receiving, from the body device, alternating current responsive to the substantially sinusoidal test voltage, and a rectifying circuit for detecting amplitude of alternating voltage of the terminal impedance component.

4. The plug-in unit according to claim 2, wherein the monitoring circuit comprises a measurement bridge connected to the first and second poles of the electrical connector and comprising a reference circuit adapted to simulate driving point impedance prevailing between the first and second poles of the electrical connector when the plug-in unit is correctly installed.

5. The plug-in unit according to claim 1, wherein the test signal generator comprises a test traffic transmitter configured to modulate the test signal with a pre-determined reference bit sequence.

6. The plug-in unit according to claim 5, wherein the monitoring circuit comprises a detector configured to detect a bit sequence from the quantity responsive to the test signal, and the monitoring circuit further comprises a comparing circuit configured to produce a bit error ratio of the detected bit sequence with respect to the pre-determined reference bit sequence.

7. The plug-in unit according to claim 1, wherein the plug-in unit comprises a processing system for supporting at least one on the following data transfer protocols: Internet Protocol "IP", Ethernet protocol, MultiProtocol Label Switching "MPLS" protocol, or Asynchronous Transfer Mode "ATM".

8. An equipment, comprising:
one or more plug-in units involving a first plug-in unit;
a body device for receiving the one or more plug-in units;
electrical connectors in the one or more plug-in units and in the body device, the electrical connectors being suitable for providing galvanic contacts between each of the one or more plug-in units and the body device;
a test signal generator for supplying a test signal to a measurement circuit comprising first and second galvanic contacts provided by the electrical connectors between the body device and the first plug-in unit, the frequency spectrum of the test signal belonging at least partly to a frequency band used in data transfer between the first plug-in unit and the body device; and
a monitoring circuit for generating an indicator signal indicative of a difference between a quantity responsive to the test signal when current responsive to the test signal flows via the first and second galvanic contacts and a reference of the quantity, the indicator signal being also indicative of correctness of the installation of the first plug-in unit in the body device.

9. The equipment according to claim 8, wherein the test signal generator and the monitoring circuit are located in the first plug-in unit.

10. The equipment according to claim 8, wherein the test signal generator is located in the first plug-in unit and the monitoring circuit is located in a second plug-in unit that is one of the plug-in units of the equipment and other than the first plug-in unit.

11. The equipment according to claim 8, wherein the test signal generator is located in the body device and the monitoring circuit is located in the first plug-in unit.

12. The equipment according to claim 8, wherein the test signal generator is located in the first plug-in unit and the monitoring circuit is located in the body device.

13. The equipment according to claim 10, wherein the first plug-in unit is a control plug-in unit configured to produce, in addition to the indicator signal related to the first plug-in unit, corresponding signals related to other plug-in units of the equipment.

14. The equipment according to claim 8, wherein the equipment is at least one of the following: an internet protocol "IP" router, an Ethernet switch, a MultiProtocol Label Switching "MPLS" switch, or an Asynchronous Transfer Mode "ATM" switch.

15. A method for indicating correct installation of a plug-in unit in a body device, the method comprising:
supplying a test signal to a measurement circuit comprising at least first and second galvanic contacts provided by electrical connectors between the body device and the plug-in unit; and
generating an indicator signal indicative of a difference between a quantity responsive to the test signal when current responsive to the test signal flows via the first and second galvanic contacts and a reference of the quantity, the indicator signal being also indicative of correctness of the installation of the first plug-in unit in the body device,
wherein a frequency spectrum of the test signal belongs at least partly to a frequency band used in data transfer between the plug-in unit and the body device.

16. The plug-in unit according to claim 2, wherein the plug-in unit comprises a processing system for supporting at least one on the following data transfer protocols: Internet Protocol "IP", Ethernet protocol, MultiProtocol Label Switching "MPLS" protocol, or Asynchronous Transfer Mode "ATM".

17. The plug-in unit according to claim 3, wherein the plug-in unit comprises a processing system for supporting at least one on the following data transfer protocols: Internet Protocol "IP", Ethernet protocol, MultiProtocol Label Switching "MPLS" protocol, or Asynchronous Transfer Mode "ATM".

18. The plug-in unit according to claim 4, wherein the plug-in unit comprises a processing system for supporting at least one on the following data transfer protocols: Internet Protocol "IP", Ethernet protocol, MultiProtocol Label Switching "MPLS" protocol, or Asynchronous Transfer Mode "ATM".

19. The plug-in unit according to claim 5, wherein the plug-in unit comprises a processing system for supporting at least one on the following data transfer protocols: Internet Protocol "IP", Ethernet protocol, MultiProtocol Label Switching "MPLS" protocol, or Asynchronous Transfer Mode "ATM".

20. The plug-in unit according to claim 6, wherein the plug-in unit comprises a processing system for supporting at least one on the following data transfer protocols: Internet Protocol "IP", Ethernet protocol, MultiProtocol Label Switching "MPLS" protocol, or Asynchronous Transfer Mode "ATM".

* * * * *